(12) United States Patent
Salah et al.

(10) Patent No.: US 9,952,802 B2
(45) Date of Patent: Apr. 24, 2018

(54) VOLATILE MEMORY ERASURE BY CONTROLLING REFRESHMENT OF STORED DATA

(71) Applicant: Khalifa University of Science and Technology, Abu Dhabi (AE)

(72) Inventors: Khaled Hamed Salah, Abu Dhabi (AE); Baker Shehadah Mohammad, Abu Dhabi (AE); Mahmoud Abdullah Al-Qutayri, Abu Dhabi (AE); Bushra Abbas Mohammed Essa Albelooshi, Abu Dhabi (AE)

(73) Assignee: KHALIFA UNIVERSITY OF SCIENCE AND TECHNOLOGY, Abu Dhabi (AE)

( * ) Notice: Subject to any disclaimer, the term of this patent is extended or adjusted under 35 U.S.C. 154(b) by 7 days.

(21) Appl. No.: 14/627,133

(22) Filed: Feb. 20, 2015

(65) Prior Publication Data

US 2016/0246542 A1    Aug. 25, 2016

(51) Int. Cl.
*G11C 11/406* (2006.01)
*G06F 3/06* (2006.01)
*G11C 7/10* (2006.01)
*G11C 8/10* (2006.01)
*G11C 11/4072* (2006.01)

(Continued)

(52) U.S. Cl.
CPC .......... *G06F 3/0652* (2013.01); *G06F 3/0608* (2013.01); *G06F 3/0673* (2013.01); *G11C 7/106* (2013.01); *G11C 7/1087* (2013.01); *G11C 8/10* (2013.01); *G11C 11/406* (2013.01); *G11C 11/4072* (2013.01); *G11C 11/4087* (2013.01); *G11C 11/4093* (2013.01)

(58) Field of Classification Search
CPC ............ G11C 11/406–11/40626; G06F 3/0652
See application file for complete search history.

(56) References Cited

U.S. PATENT DOCUMENTS 5,798,976 A * 8/1998 Arimoto ............... G11C 11/406
                                                365/222
5,943,681 A * 8/1999 Ooishi ................. G06F 12/0804
                                                365/189.05

(Continued)

*Primary Examiner* — Nicholas Simonetti
(74) *Attorney, Agent, or Firm* — Hayes Soloway PC

(57) ABSTRACT

A method of erasing volatile memory requiring refreshment using refresh circuitry to maintain data storage, the method comprising controlling the refresh circuitry for preventing refreshment of the memory upon occurrence of a predefined event which would require erasure of data stored in the memory by a previous user, process, application or service. A computer readable medium encoded with processor executable instructions for execution by a processing unit for controlling a refresh circuitry connected to a volatile memory for preventing refreshment of the memory at the predefined event. A refresh circuitry adapted to be connected to a volatile memory requiring refreshment using the refresh circuitry to maintain data storage, the refresh circuitry being adapted to prevent the refreshment of the memory at the occurrence of the predefined event. A volatile memory comprising a refresh circuitry adapted to prevent the refreshment of the memory at the occurrence of the predefined event.

22 Claims, 14 Drawing Sheets

(51) Int. Cl.
*G11C 11/408* (2006.01)
*G11C 11/4093* (2006.01)

(56) References Cited

U.S. PATENT DOCUMENTS

| | | | | |
|---|---|---|---|---|
| 2008/0244737 | A1* | 10/2008 | Hayasaka | G06F 21/6209 726/21 |
| 2008/0263339 | A1* | 10/2008 | Kriegel | G06F 9/461 712/228 |
| 2011/0022791 | A1* | 1/2011 | Iyer | G06F 12/08 711/105 |
| 2012/0047313 | A1* | 2/2012 | Sinha | G06F 12/08 711/6 |
| 2014/0068166 | A1* | 3/2014 | Fukumura | G06F 13/1668 711/104 |

* cited by examiner

VOLATILE MEMORY ERASURE BY CONTROLLING REFRESHMENT OF STORED DATA

FIELD OF THE INVENTION

The present invention relates generally to volatile memory erasure and more particularly to a method, a computer readable medium, a refresh circuitry and a volatile memory adapted for erasing the data stored inside one or more memory banks of the memory.

BACKGROUND OF THE INVENTION

In the cloud virtualized infrastructure, multiple tenants may co-exist in the same physical host, sharing the host's physical DRAM memory and disk storage. Virtualization technology used in the cloud creates the illusion of having multiple virtual machines (VMs) within the same physical host by means of sharing and multiplexing the host resources which include its multiple CPU cores, physical memory, and hard disk. FIG. 1 shows three VMs which belong to different users that are allocated portions of physical memory and hard disk.

In the cloud, the VMs are allocated on demand and dynamically to different users. A VM may stay running for some period of time (minutes, hours, or days) and then get terminated by a user. Once terminated, its resources are re-allocated to a newly provisioned VM. Each time a new VM is allocated, its resources are allocated from the older VM resources, as shown in FIG. 2.

FIG. 2 illustrates resource allocation after termination of VM2 and provisioning of VM4. FIG. 2($a$) shows that the memory and disk resources of VM2 are available for use after VM2 termination. In FIG. 2($b$), a new virtual machine is provisioned by user 4 (VM4) and has been allocated the memory and disk resources of VM2. Once VM4 is running, the user of this VM can have access to the content of DRAM and disk storage which was used by the older user. The new user can simply take memory images and snapshots and then perform offline forensic analysis to extract sensitive information of the older user. This indeed poses a serious data privacy problem.

As has been illustrated, a critical security problem and data privacy issue can exist if the DRAM content is not sanitized or wiped out before being allocated to a newly provisioned VM. The cloud provider has to provide a total isolation and protection of user data during run time and after termination. If the data in physical memory and hard disk are not properly sanitized and deleted at run time and after deletion, sensitive information can be leaked, thereby jeopardizing the privacy of the cloud users and their data. Sensitive information may include confidential documents and images, passwords, encryption keys, personal information and records, banking and credit card information, metadata, etc.

The cloud computing platform is just one example of contexts where physical memory is shared between multiple users. A single physical machine can also provide access to multiple users in a sequential manner such that different sessions are initiated and terminated for different users. If data stored on the physical memory by one user is not deleted, this data can be accessed by a subsequent user accessing the machine.

To date, wiping out the DRAM and disk storage, if done, is performed using software by means of zeroing out DRAM content using software. At boot time of the newly provisioned VM, the software would write zeroes or random data to the DRAM. The zeroing out method involves the CPU to carry out sequential memory-write operations of zeros to all physical memory locations. This is considerably slow and expensive operation especially. For a small size, it may take a few seconds to wipe out 1 GB DRAM. For larger-size VMs, the DRAM portion can be as big as 64 GB or more. For this, wiping out the memory using software may take a few minutes. Such time is not acceptable in some contexts such as by the cloud user as it prolongs the launch and boot time of VM instances.

Other methods can zero out the memory using software at user session/VM termination (and not at boot time). Still, this solution is not adequate and will slow down enormously the availability of the freed memory to be allocated to newly provisioned users/VMs.

In short, software solutions that deal with zeroing out the physical memory at boot up or after termination are not adequate solutions, due to the computation overhead cost. That is, such software solutions will be considerably slow considering the size of the allocated RAM which can be in tens of gigabytes. Such solutions may take minutes, and will stretch the bootup time enormously. Equally, it is also imperative to shorten the termination time of a machine (such as a VM) so that freed resources can be allocated quickly to newly provisioned VMs.

SUMMARY OF THE INVENTION

The present invention aims to overcome the above mentioned limitations and other problems associated with the prior art.

DRAM provides maximum memory density at cost of access time. Basic DRAM cell 3 consists of one nMOS transistor and one capacitor (FIG. 3). The transistor is used to control access to the storage element (capacitor). The memory state is stored as charge on the capacitor. Since the charge on the capacitor can leak away hence, the need for refreshing when DRAM is used. The refreshing time is determined by the time the capacitor can maintain enough charge to indicate logic one. In addition to refreshing DRAM read access is destructive which means when the cell gets access for read the data stored is disturbed and another operation need to be performed to re-store data.

Memory controller keeps track of memory array access and refreshing times. It is proposed to utilize this hardware feature that already exists to zeroing DRAM content. This provides hardware managed solution which is much faster than the software counterpart. The implementation of the proposed scheme can vary based on the tradeoff between memory availability, area overhead, and design complexity.

The present invention proposes to prevent refresh operation on the interested array in the volatile memory. This will let the charge to leak away and for all cells to be zero. The array size can be static for all programs and will depend on the total memory size or it can be dynamic based on number of programs and overall system performance. FIG. 4 depicts a typical memory array organization with a major interface where N+M are address bits and D is the data interface. FIG. 5 depicts a typical memory organization with multiple banks with the total size of $2^{(M+1)}2^{(N+1)}2^{(K+1)}$. A typical VM system requires RAM sizes ranges from 1 GB to 16 GB and each array size is ranged from 256 KB to 1 MB.

The present invention provides a method, a erasure module in the form of computer readable instructions, a refresh circuitry and a volatile memory adapted for preventing the refresh operation on the interested array. This will let the charge to leak away and for all cells to be zero. The array size can be static for all programs and will depend on the total memory size or it can be dynamic based on number of programs and overall system performance.

As a first aspect of the invention, there is provided a method of erasing a volatile memory requiring refreshment using a refresh circuitry to maintain data storage, the erasure method comprising controlling the refresh circuitry for preventing the refreshment of the memory at the occurrence of a predefined event.

As another aspect of the invention, there is provided a computer readable medium encoded with processor executable instructions for execution by a processing unit for controlling a refresh circuitry connected to a volatile memory for preventing refreshment of the memory at a predefined event.

As a further aspect of the invention, there is provided a refresh circuitry adapted to be connected to a volatile memory requiring refreshment using the refresh circuitry to maintain data storage, the refresh circuitry being adapted to prevent the refreshment of the memory at the occurrence of a predefined event.

As a further aspect of the invention, there is provided a volatile memory comprising a refresh circuitry adapted to prevent the refreshment of the memory at the occurrence of a predefined event.

In an embodiment of the present invention, the volatile memory is adapted to be connected to a processing unit accessible by multiple users and wherein the predefined event is before switching between a first user and a subsequent user such that any data stored inside the memory by the first user leaks by the effect of the memory refreshment prevention before the subsequent user is provided access to the memory.

In an embodiment of the present invention, the processing unit is part of a virtual machine in a computing cloud.

In an embodiment of the present invention, the processing unit is part of an electronic device or server.

In an embodiment of the present invention, the volatile memory is adapted to be dynamically allocated to multiple processing units and wherein the predefined event is before reallocation of the memory from a first processing unit to a second processing unit such that any data stored inside the memory using the first processing unit leaks by the effect of the memory refreshment prevention before the second processing unit is being reallocated the memory.

In an embodiment of the present invention, the processing units are part of one or more virtual machines in a computing cloud.

In an embodiment of the present invention, the volatile memory for erasure is one or more memory banks of a dynamic random access memory (DRAM).

In an embodiment of the present invention, the step of controlling the refresh circuitry for preventing the refreshment of the memory is implemented using processor executable instructions, said event being predefined using the processor executable instructions.

In an embodiment of the present invention, the processor executable instructions are adapted to be run by a hypervisor running one or more virtual machines.

In an embodiment of the present invention, the event is predefined using processor executable instructions and wherein the refresh circuitry is adapted to receive an electrical signal from a processing unit executing said processor executable instructions for preventing the refreshment of the memory at the occurrence of said predefined event.

In an embodiment of the present invention, the refresh circuitry is a DRAM Controller. Preferably, the DRAM Controller comprises a Content Addressable Memory (CMA) adapted to receive and store addresses of memory banks to be erased and to restrict access operations to these banks during a restriction time period. Preferably, the restriction time period is predefined and stored at the CMA.

BRIEF DESCRIPTION OF THE DRAWINGS

FIG. 12 *b*) is a block diagram illustrating a volatile memory, a refresh circuitry external to the volatile memory and a erasure module in accordance with an embodiment of the invention;

DETAILED DESCRIPTION OF THE INVENTION

The present invention provides a software-hardware based technique to erase the data stored on volatile memory. As volatile memory needs to be refreshed regularly in order to preserve data from leakage, the present invention proposes a method (see FIGS. 6-7), a refresh circuitry adapted to erase the memory by preventing the refresh operation from occurring (see FIGS. 8-10), and a computer encoded medium comprising a erasure module (see FIG. 11). There is also proposed a volatile memory adapted to prevent the refresh operation at the occurrence of a specific predefined event (see FIG. 12).

Figure 1:
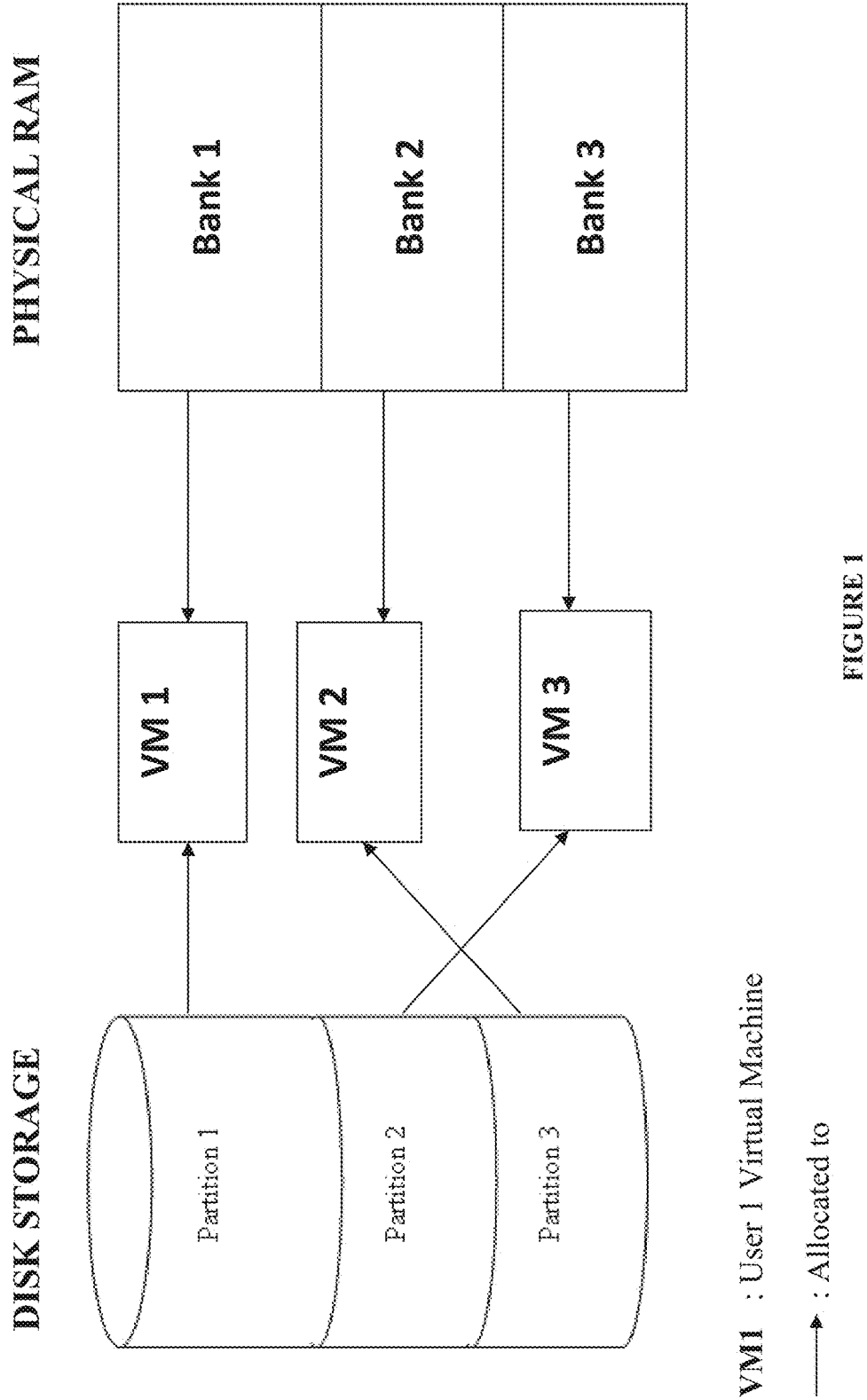
FIG. 1 illustrates a typical virtual machines resource allocation for multiple users in the cloud within a single physical machine.
Figure 2:
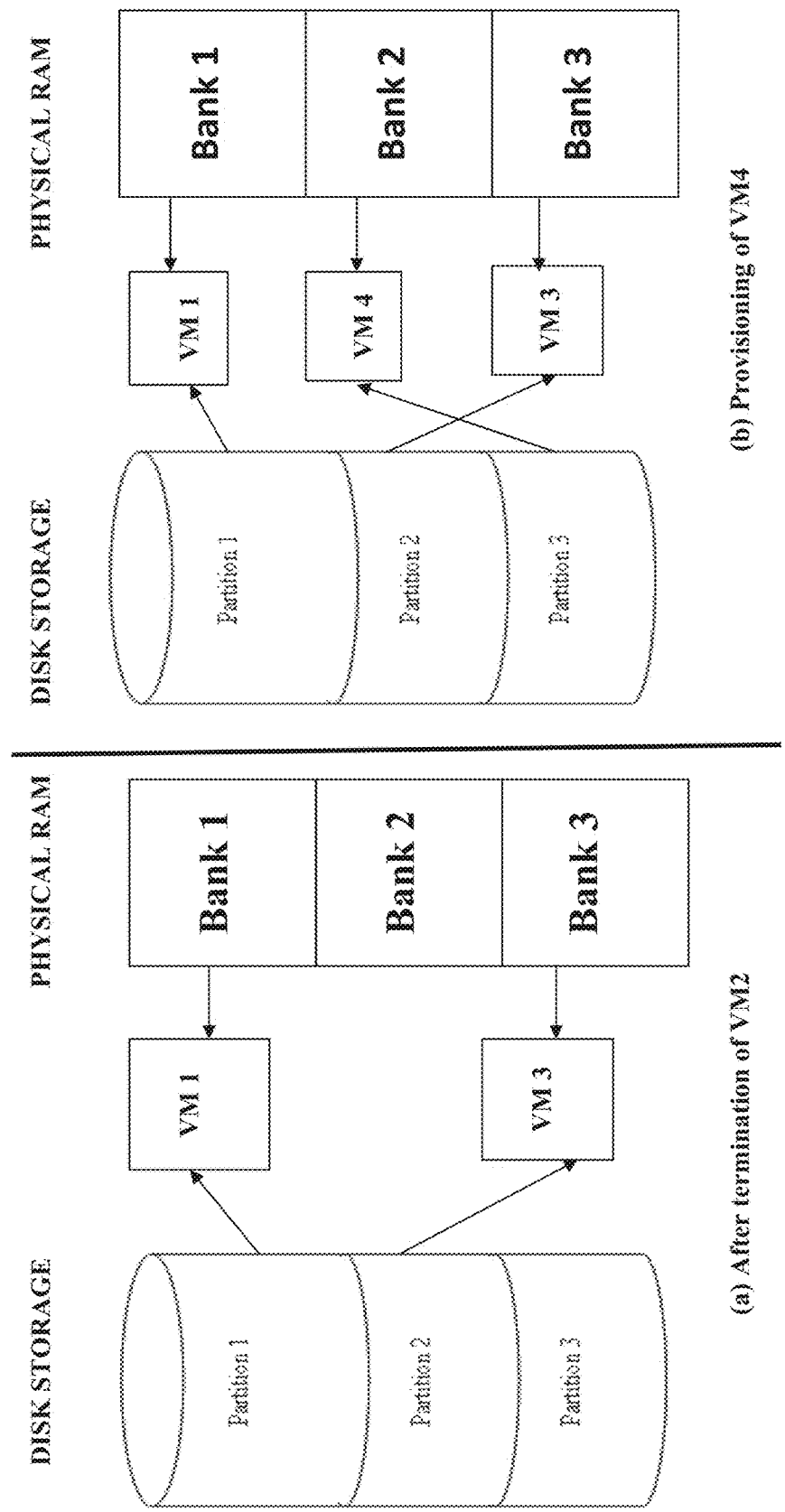
FIG. 2 illustrates resource allocation after termination of VM2 and provisioning of VM4.
Figure 3:
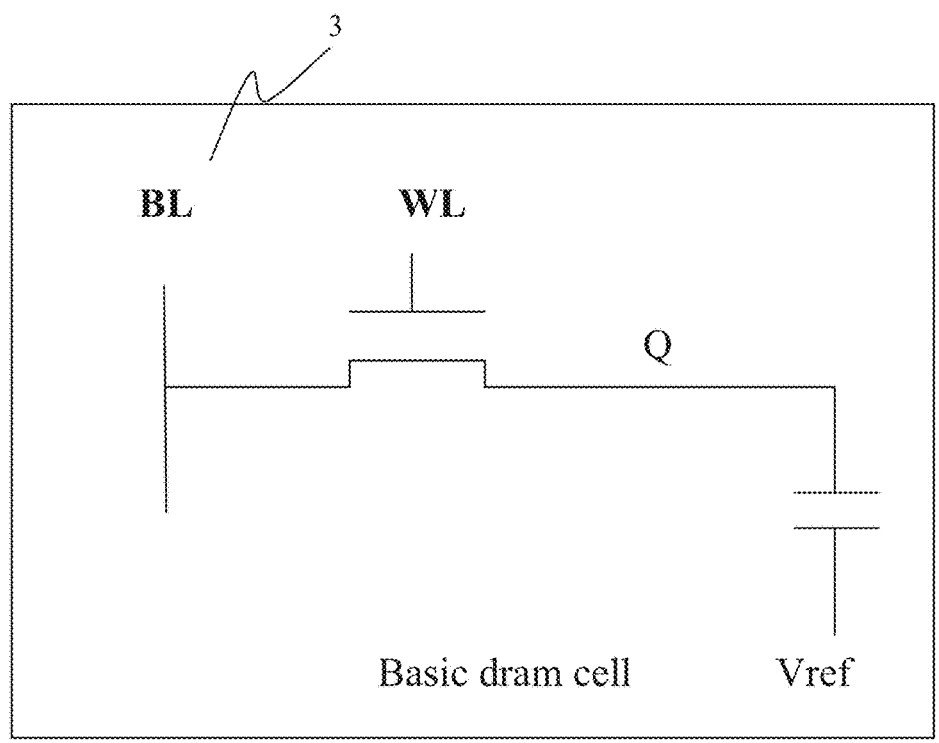
FIG. 3 illustrates a DRAM cell structure.
Figure 4:
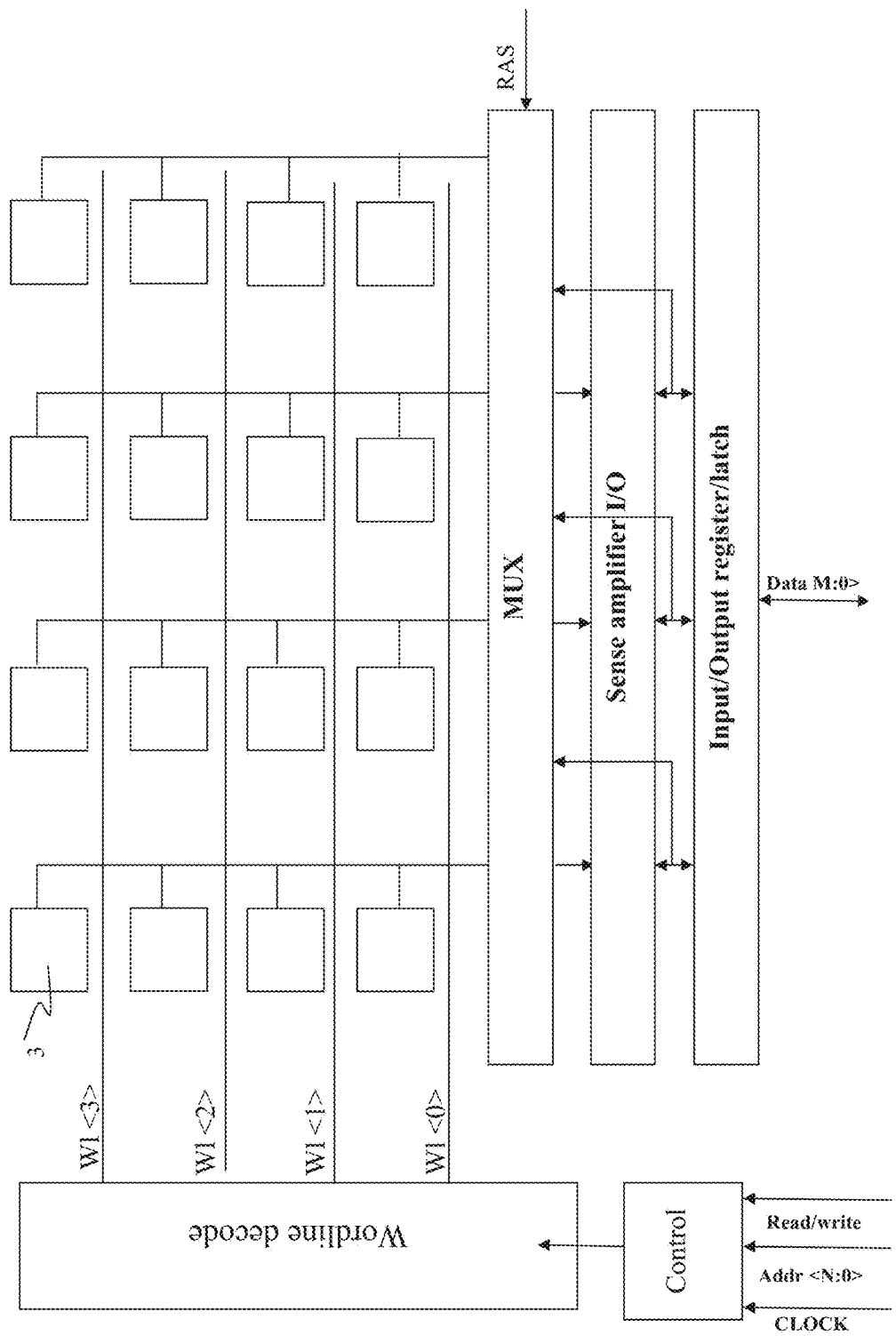
FIG. 4 illustrates a typical memory array organization where major interface N+M are address bits and D is the data interface.
Figure 5:
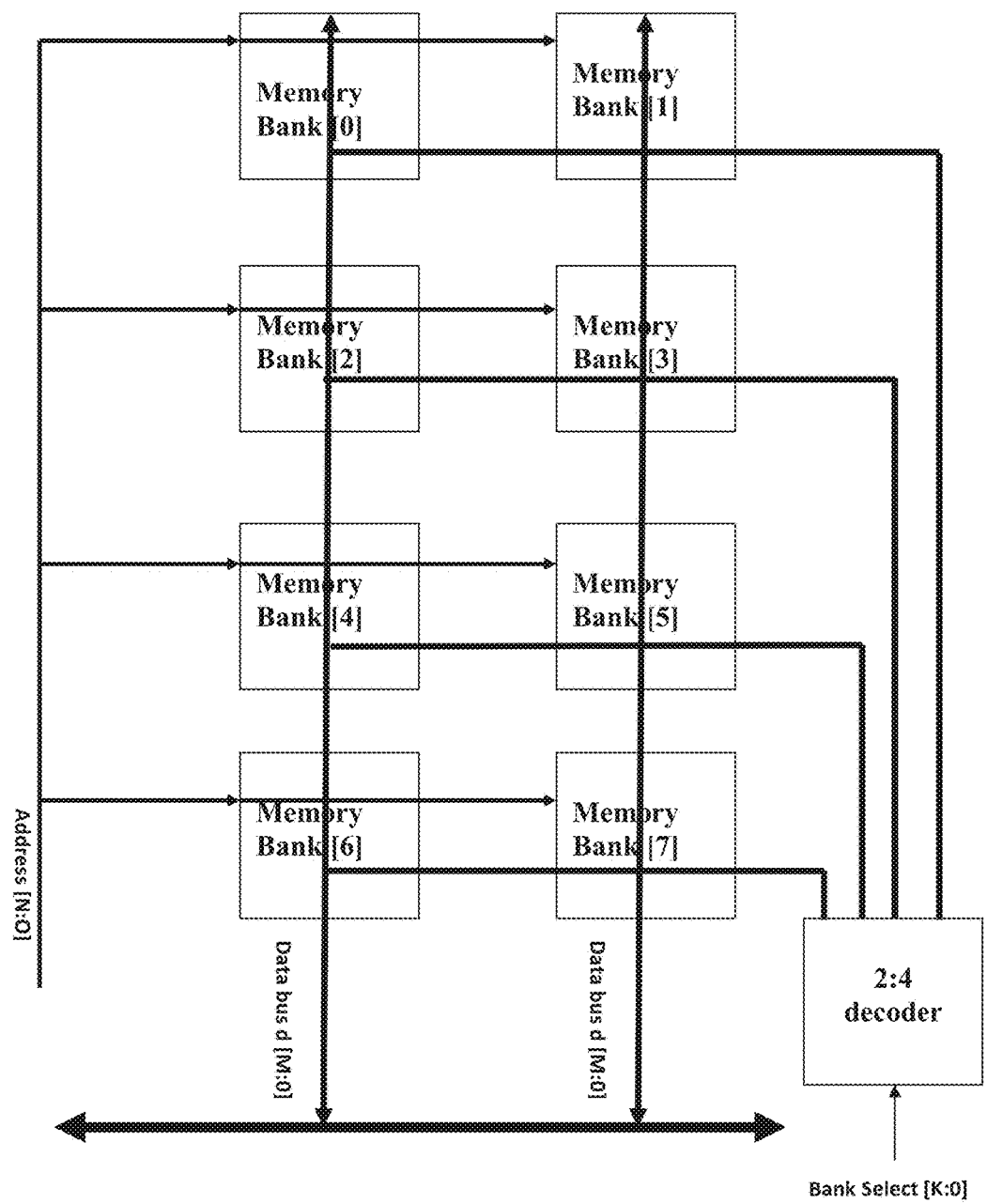
FIG. 5 illustrates a typical memory organization with multiple banks with the total size of $2^{(M+1)}2^{(N+1)}2^{(K+1)}$.
Figure 6:
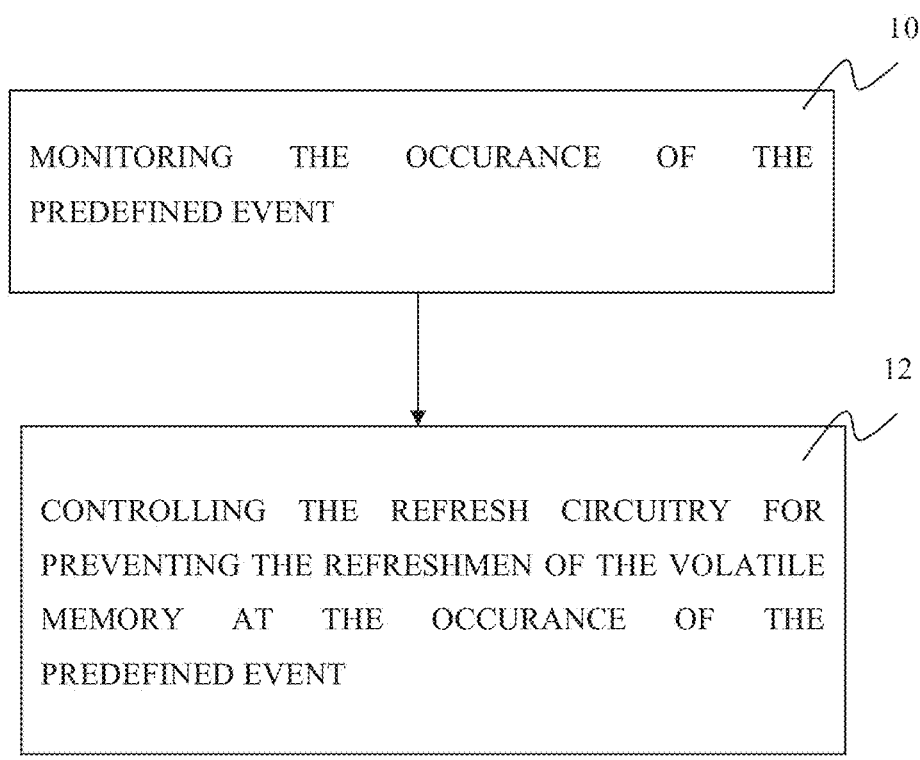
FIG. 6 illustrates a method of erasing a dynamic memory in accordance with an embodiment of the invention.

As a first aspect of the invention, as illustrated in FIG. 6, there is provided a method of erasing a volatile memory requiring refreshment using a refresh circuitry to maintain data storage, the erasure method comprising controlling the refresh circuitry for preventing the refreshment of the memory at the occurrence of a predefined event. The erasure process according to this invention does not involve any writing/reading of the memory, and only involves restricting the memory of being read/written for a predefined period of time which is at least equivalent the interval of time required for refreshing the memory.

According to this method, the first step is to monitor the occurrence of the predefined event 10. Once the predefined event occurs, the second step is to control the refresh circuitry 32 for preventing the refreshment of the volatile memory 30 once the predefined event occurs 12.

The predefined event can be any event configured a priori by a user which when it occurs, data stored on the volatile memory 30 needs to be deleted. When the memory 30 is used by users, processes, applications, and/or services, the predefined event can be for example at the time of use termination and/or switching between the different users, processes, applications and/or services respectively. For example, when the volatile memory 30 is accessed/shared by multiple users, the predefined event can be after termination of a first user session and/or at the time of switching between one user and another (after session termination of a first user and before session commencement of a subsequent user). This is in order to clean/erase the data stored by a first user on the memory before a second user is granted access to the memory. Sharing volatile memory 30 between multiple users can happen in various contexts, such as for example in computing clouds where virtual machines accessing a same volatile memory 30 are accessed by multiple users. Computing clouds are not the only environments where memory is shared between users. When the volatile memory 30 is accessed by different processes, applications and/or services (related or not to different users), the predefined event can be at the time of termination of a first process, application and/or service respectively and/or at the time of switching between different processes, applications and/or services.

This can also happen for example in the case of a single machine with multiple user accounts. Once a first user uses the machine, data is normally stored on the volatile memory 30 and is not deleted until the machine is rebooted. Where the machine is not rebooted, a subsequent user accessing the machine can have access to the data stored inside the volatile memory 30. This also poses a risk of privacy breach. The predefined event can be in this case at the termination of the first user session. In this case, data stored on the volatile memory 30 is erased before the commencement of the second user session.

Figure 7:
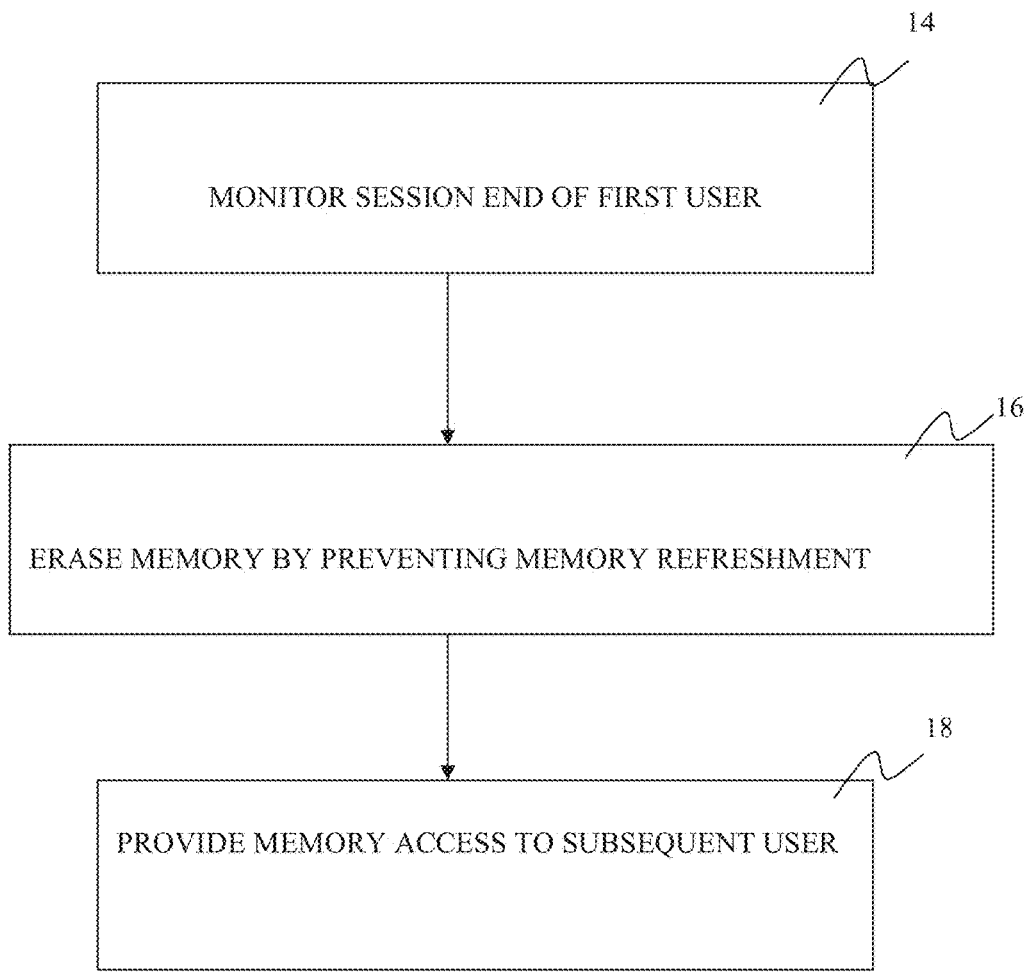
FIG. 7 is a flow chart illustrating an example of application of the method of erasing a dynamic memory in accordance with an embodiment of the invention.

As illustrated in FIG. 7, according to an embodiment of the invention, the first step is to monitor the termination of the first user session 14. Once the first user session is terminated, the volatile memory is erased by preventing the refreshment of the memory 16. Then, the subsequent user is provided access to the memory which is already erased 18. In this case, there will be no need to reboot the machine to delete the data stored on the memory by the first user or use erasure software which can be time consuming. Erasing the memory using the method of this invention occurs very quickly (in the order of milliseconds).

Figure 8:
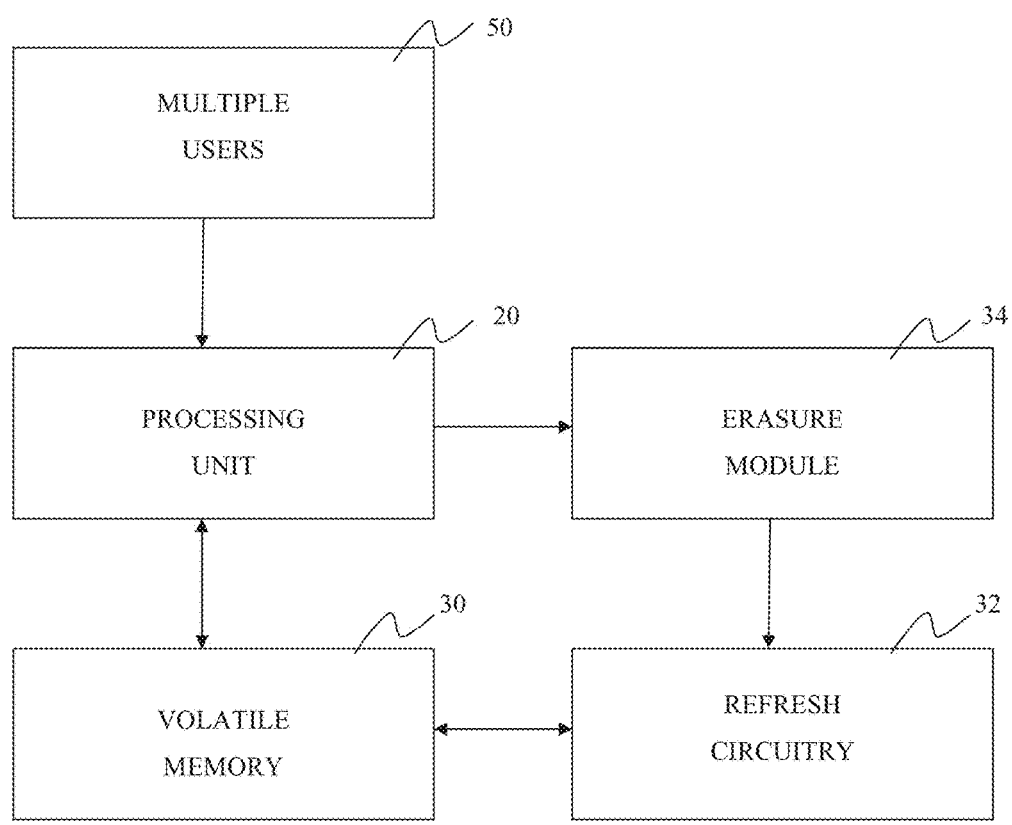
FIG. 8 is a block diagram illustrating multiple user access to a processing unit connected to a volatile memory, erasure module and refresh circuitry in accordance with an embodiment of the invention.

As illustrated in FIG. 8, the volatile memory 30 can for example be connected to a processing unit 20 accessible by multiple users. In this case, the predefined event is before switching between a first user and a subsequent user such that any data stored inside the memory 30 by the first user leaks by the effect of the memory refreshment prevention before the subsequent user is provided access to the memory 30. The predefined event is preconfigured using computer readable instructions inside the erasure module 34. The erasure module 34 can run on the same processing unit 20 or on a different processing unit depending on the application. The erasure module 34 is connected to the refresh circuitry 32 which in turn is connected to the volatile memory 30. Once the predefined event occurs, the erasure module 34 controls the refresh circuitry 32 in a manner to prevent the refresh circuitry 32 from refreshing the data inside the volatile memory 20. The erasure module 34 comprises computer instructions adapted to instruct the refresh circuitry 32 for preventing refreshment of the volatile memory 30.

In an embodiment of the invention, the processing unit 20 is part of a virtual machine in a computing cloud. In another embodiment of the invention, the processing unit 20 is part of an electronic device or server.

Figure 9:
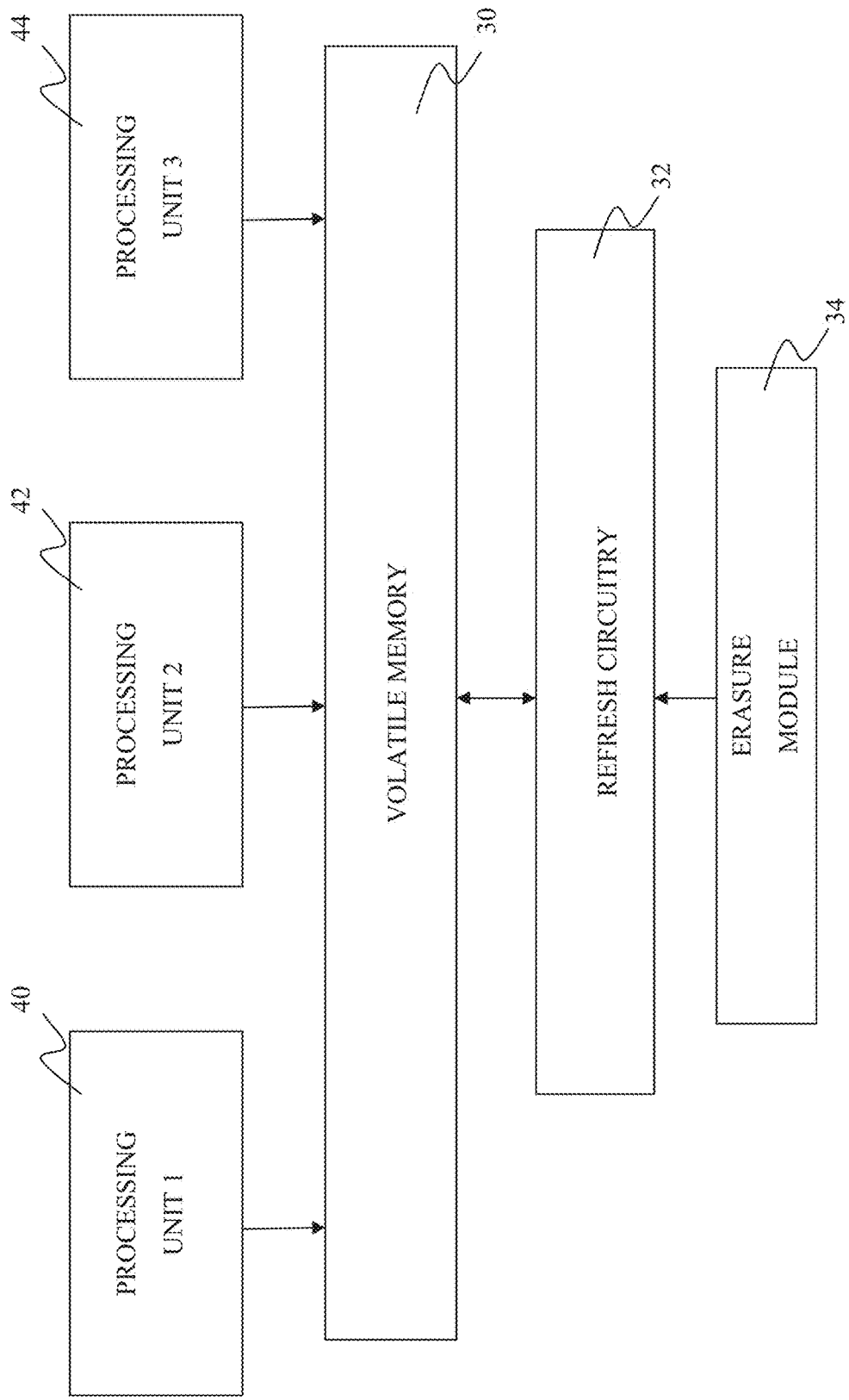
FIG. 9 is a block diagram illustrating multiple processing units connected to a volatile memory, erasure module and refresh circuitry in accordance with an embodiment of the invention.

As illustrated in FIG. 9, the volatile memory 30 can be connected to multiple processing units (40, 32, 44) for dynamically allocating the volatile memory 30 to the multiple processing units (40, 32, 44). In this case, the predefined event is before reallocation of the memory 30 from a first processing unit to a second processing unit such that any data stored inside the memory using the first processing unit leaks by the effect of the memory refreshment prevention before the second processing unit is being reallocated the memory 30. The predefined event is preconfigured using computer readable instructions inside the erasure module 34. The erasure module 34 can run on any one of the processing units (40, 32, 44) or on a different processing unit depending on the application. The erasure module 34 is connected to the refresh circuitry 32 which in turn is connected to the volatile memory 30. Once the predefined event occurs, the erasure module 34 controls the refresh circuitry 32 in a manner to prevent the refresh circuitry 32 from refreshing the data inside the volatile memory 20. The erasure module 34 comprises computer instructions adapted to instruct the refresh circuitry 32 for preventing refreshment of the volatile memory 30.

In an embodiment of the invention, the processing units (40, 32, 42) are part of one or more virtual machines in a computing cloud.

Figure 10:
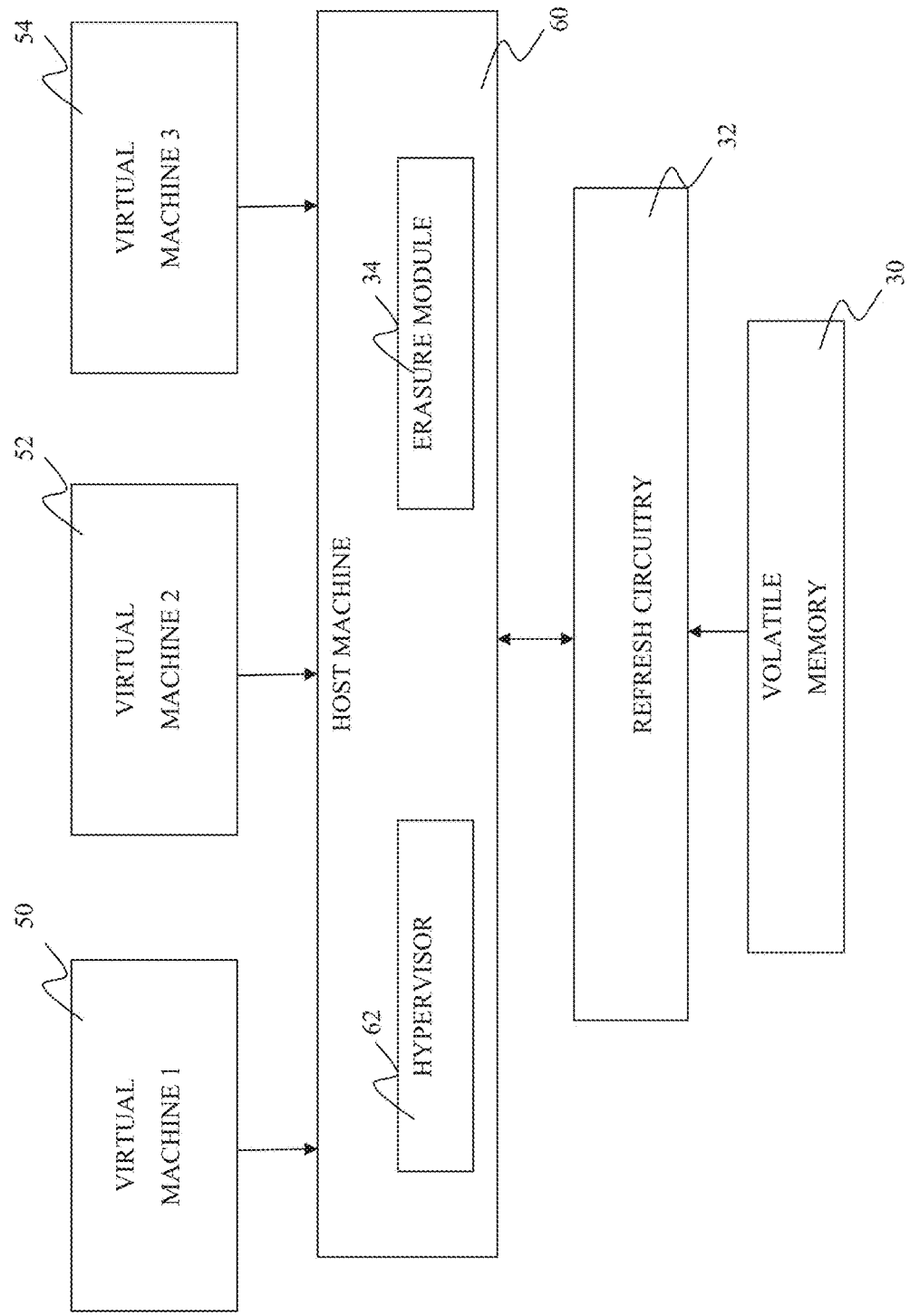
FIG. 10 is a block diagram illustrating multiple virtual machines connected to a host machine, a hypervisor, a erasure module, a refresh circuitry and volatile memory in accordance with an embodiment of the invention.

FIG. 10 illustrates the application of this invention in the context of a computing cloud comprising multiple virtual machines (50, 52, 54) and a host machine 60 comprising a hypervisor 62. The volatile memory 30 and the refresh circuitry 32 are connected to the host machine (50, 52, 54) for storing data originating from the use of the virtual machines (50, 52, 54) by different users. According to this embodiment, the erasure module 34 is adapted to run on the host machine 60 for controlling the refresh circuitry 32 in order to prevent refreshment of the data stored inside the volatile memory 30 at the occurrence of predefined events such as the switching between different users.

In an embodiment of the invention, the volatile memory 30 for erasure is one or more memory banks of a dynamic random access memory (DRAM). The volatile memory 30 can be DRAM or any other type requiring refreshment of data to maintain storage existing now or in the future. When the volatile memory 30 is DRAM, the refresh circuitry 32 is normally a DRAM controller 36. The DRAM controller 36 is adapted to receive instructions from the erasure module to prevent refreshment of the data.

Figure 14:
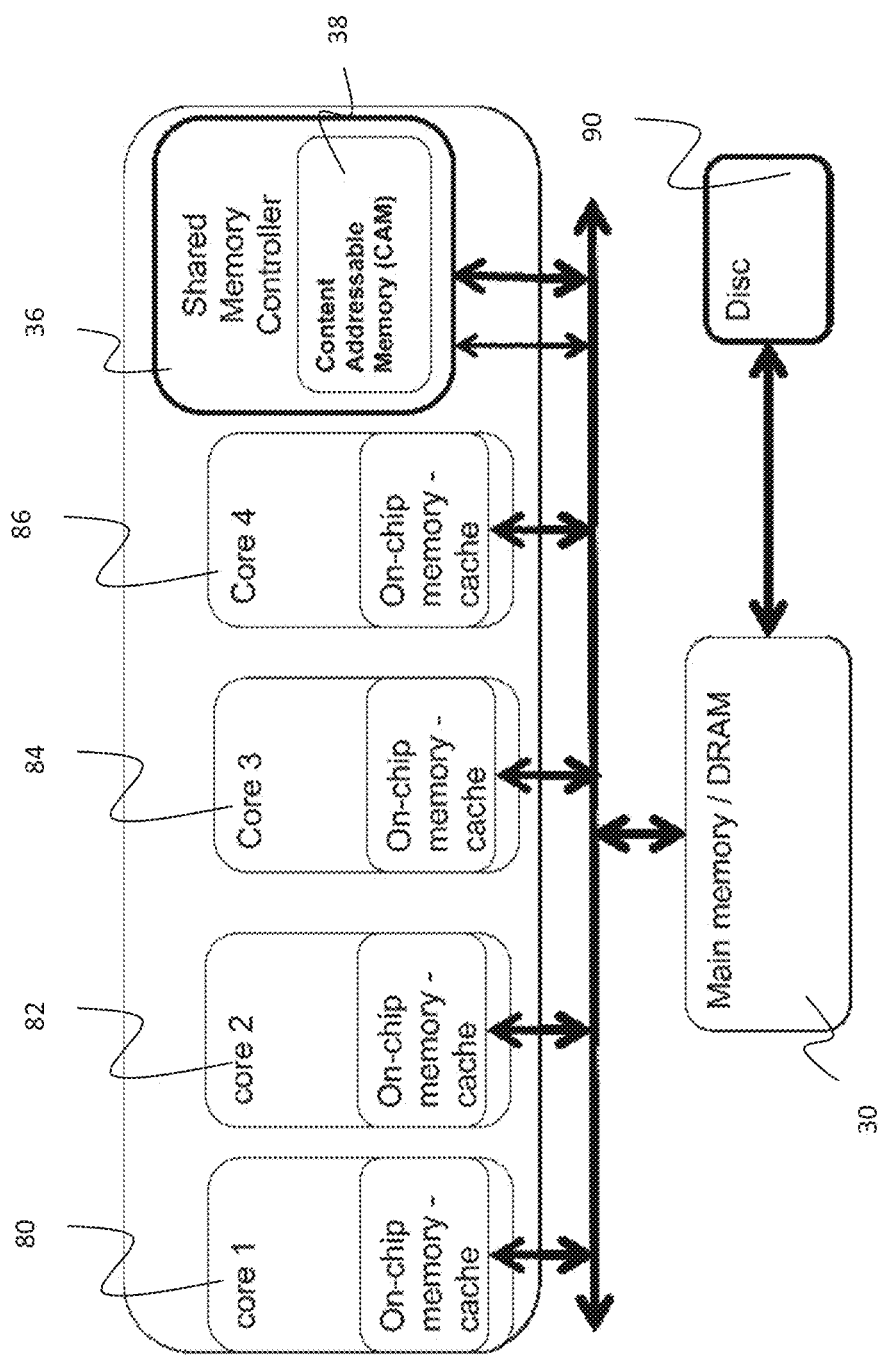
FIG. 14 is a block diagram illustrating a Content Memory Controller (CMA) in connection with a DRAM Controller in accordance with an embodiment of the invention.

As illustrated in FIG. 14, the DRAM controller 36 is adapted for the purpose of receiving instructions from the erasure module 34. The DRAM controller 36 in accordance with an embodiment of the invention comprises a Content Addressable Memory (CMA) 38 adapted to receive addresses of DRAM memory banks from core processes 80, 82, 84, 86 through the erasure module 34. The addresses are stored in a small content addressable memory and factored into the Finite State Machine (FSM) of the DRAM controller 36 to make sure that the banks listed in the CAM 38 are not allocated to any new program.

Any refresh, read and/or write operation to the DRAM 30 will first be directed to the CMA 38 for comparing the addresses of the desired memory banks to be accessed against all addresses indicated inside the CAM 38. If there is no match, then the access is granted. If there is a match, then the access is denied. The CAM 38 content is cleared based on a counter corresponding to the restriction time of the DRAM cell 30. The CAM 38 also comprises the restriction time during which access is restricted to the indicated memory banks. The restriction time is at least equivalent to the refreshing interval specific to the DRAM 30. If for example, the DRAM 30 is configured to be refreshed every 1 millisecond, the restriction time will be at least 1 millisecond. This is in order to provide sufficient time for allowing leakage of the data inside the memory banks by preventing the refresh operation of the memory 30. The restriction time can be specified in the erasure module 34 and communicated to the CAM 38. As the restriction time can vary from one memory to another, the restriction time is set as a variable inside the erasure module 32 which can be modified based on the application and the specific memory being dealt with. Optionally, the CAM 38 would also contain the size of the memory banks.

The memory bank addresses sent by the erasure module 34 to the CAM 38 are those which were used before and to be erased, for example those accessed by a previous user, process, application or service and contain data related thereto. The addresses of these banks are communicated by the operating system which has the information. The erasure module 32 can consist of, be part of and/or be running at the operating system, hypervisor, device driver or any code that can run on the host or device CPU through which the volatile memory 30 is accessible.

Figure 13:
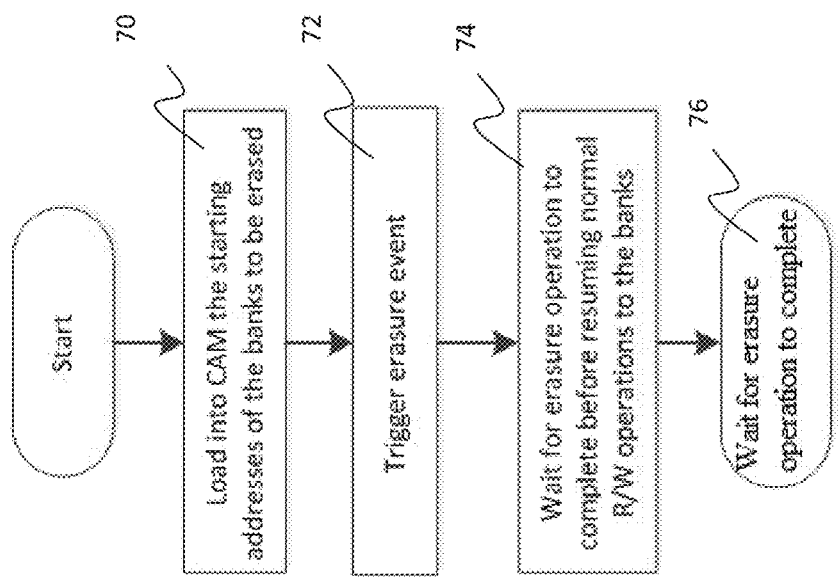
FIG. 13 is a flow chart illustrating a Content Memory Controller (CMA) operation according to an embodiment of the invention.

As illustrated in FIG. 13, the erasure module 32 sends the addresses of the banks used by a previous user to the CAM for storage 70. At the occurrence of the predefined event requiring erasure of the data 72, all access requests to the memory 30 are first directed to the CAM 38 which compares the bank addresses to which access is desired to the addresses stored inside the CAM 38 to determine if there is a match. In case there is a match, the access request is denied. In case there is no match, the access request is granted. The access request can be a refresh, write and/or read request. The CAM 38 would restrict any access to these banks the time the data stored inside them are erased by the effect of the prevention of their refreshment 74. Once the erasure operation is completed, normal read/write operations are resumed as normal 76.

The size of the CAM 38 array is determined by the erasure time of the DRAM bank and the maximum number of shared programs/users. For example, if in 64 millisecond there can be 1024 users and the number of banks in the DRAM 30 is 1024 banks, then the size of the CAM 38 array is 1024 entry×log 1024 (base 2) which is 10 bits which is total size of 4 Kilo Byte of CAM bank. This is small compared to the large size of DRAM size of 4 Giga Byte or more for example.

In an embodiment of the invention, the action of controlling the refresh circuitry 32 for preventing the refreshment of the memory 30 is implemented using processor executable instructions, where the event being predefined using the processor executable instructions.

In an embodiment of the invention, the erasure module 34 comprises these processor executable instructions. When the volatile memory 30 is in a computing cloud, in an embodiment of the invention, the processor executable instructions are adapted to be run by a hypervisor 62 running one or more virtual machines as described above.

Figure 11:
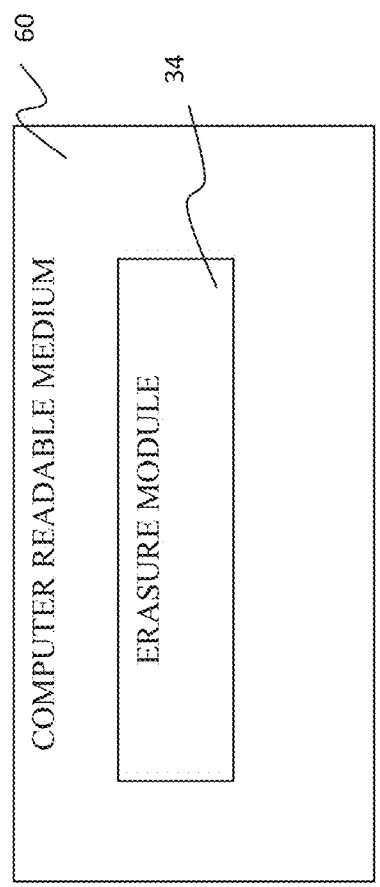
FIG. 11 illustrates a computer readable medium comprising a erasure module in accordance with an embodiment of the invention.

In an embodiment of the invention, as illustrated in FIG. 11, there is provided a computer readable medium 60 encoded with a erasure module 34 comprising processor executable instructions for execution by a processing unit for controlling a refresh circuitry 32 connected to a volatile memory 30 for preventing refreshment of the memory at a predefined event.

Figure 12A:
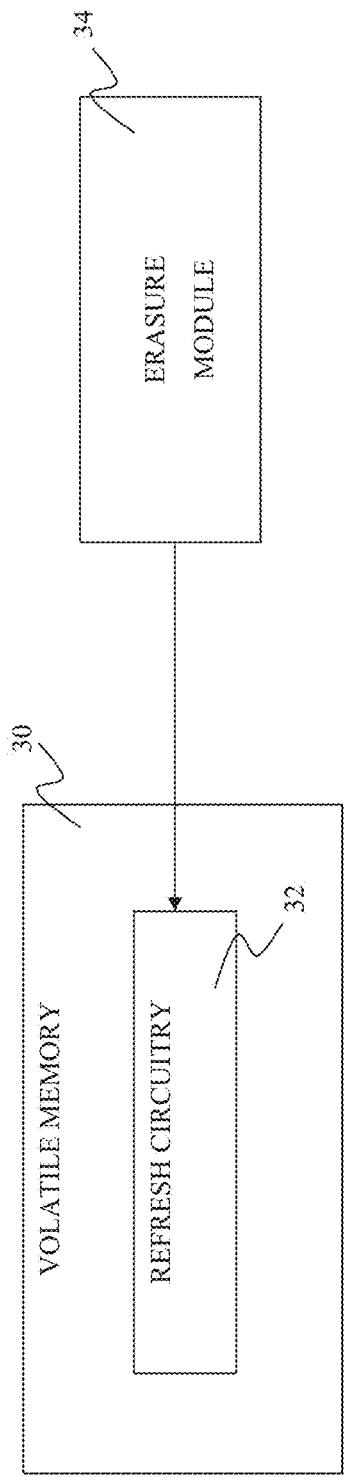
FIG. 12 *a*) is a block diagram illustrating a volatile memory comprising a refresh circuitry, and a erasure module in accordance with an embodiment of the invention.
Figure 12B:
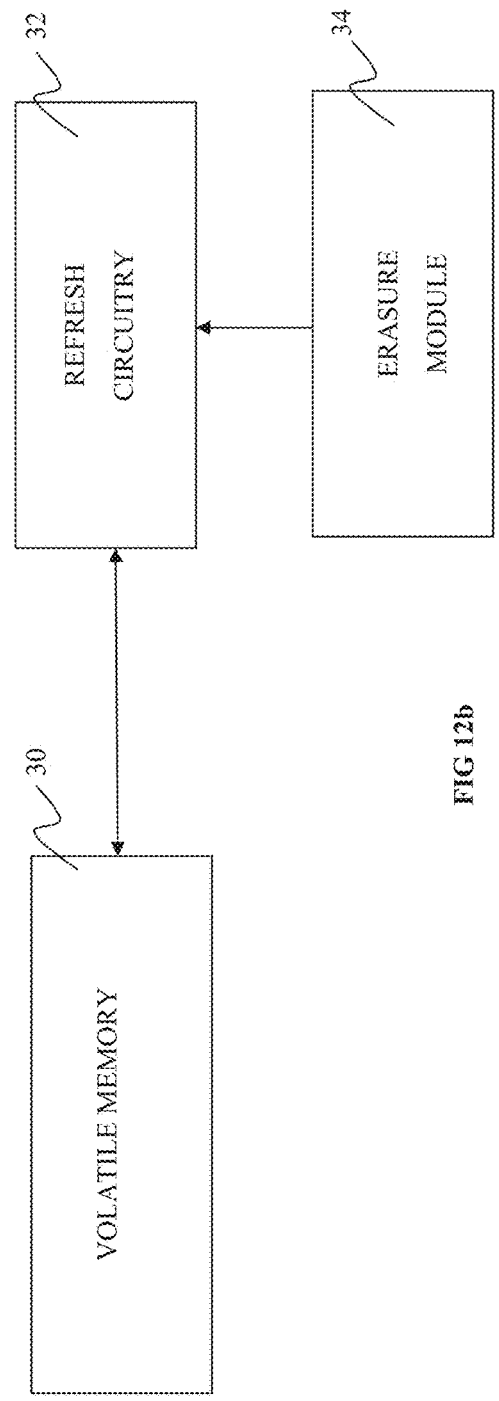

As a further aspect of the invention, as illustrated in FIGS. 12 *a*) and *b*), there is provided a refresh circuitry 32 adapted to be connected to a volatile memory 30 requiring refreshment using the refresh circuitry 32 to maintain data storage, the refresh circuitry 32 being adapted to prevent the refreshment of the memory 30 at the occurrence of a predefined event.

In an embodiment of the invention, the event is predefined using processor executable instructions (represented by a erasure module 34), where the refresh circuitry 32 is adapted to receive an electrical signal from a processing unit executing said processor executable instructions 34 for preventing the refreshment of the memory at the occurrence of said predefined event.

The refresh circuitry 32 can be part of the volatile module 30 (see FIG. 12 *a*)) or alternatively in an external circuit (see FIG. 12 *b*)).

As another aspect of the invention, there is provided a volatile memory 30 comprising a refresh circuitry 32 adapted to prevent the refreshment of the memory at the occurrence of a predefined event. The refresh circuitry 32 is adapted to be connected to a erasure module 34 comprising computer instructions for controlling the refresh circuitry 32 at the occurrence of the predefined event for preventing the refreshment of the data inside the memory 30. In an embodiment of the invention, the volatile memory 30 is a DRAM and the refresh circuitry is a DRAM controller 36 adapted to be in connection with the erasure module 32 for receiving the bank addresses to be blocked (which are used by previous users) for a restriction time period equal or superior to the refreshing interval of the DRAM 30 in order to allow the leakage of data from these memory banks before access to these banks is provided again.

There are other ways of using hardware to erase the memory 30 in order to provide an expedite process of cleaning data.

Although the above description of the present invention has disclosed the features of the invention as applied to the preferred embodiment; additions, omissions and modifications applied to the details of the embodiment illustrated may be made by those skilled in the art without departing from the essential characteristic of the present invention.

Although the invention has been explained in relation to its preferred embodiment, it is to be understood that many other possible modifications and variations can be made without departing from the spirit and scope of the invention as herein described.

The invention claimed is:

1. A method of erasing a volatile memory requiring refreshment using a refresh circuitry to maintain data storage, the erasure method comprising:
controlling the refresh circuitry for preventing the refreshment of the memory at the occurrence of a predefined event, wherein the volatile memory is one or more memory banks of a dynamic random access memory (DRAM) and is connected to a processing unit accessible by multiple users, processes, applications or services; and
wherein the predefined event is before switching between a first user, process, application or service and a subsequent user, process, application or service such that any data stored inside the memory by the first user leaks by the effect of the memory refreshment prevention before the subsequent user, process, application or service is provided access to the memory; and the refresh circuitry is a DRAM controller, and wherein the controlling includes:
receiving and storing addresses of memory banks, and restricting access operations to these memory banks during a restriction time period that provides sufficient time for allowing leakage of data in the memory banks by preventing the refreshment of the memory, and
once the restriction time period is completed, resuming the refreshment of the memory.

2. The method of claim 1 wherein the processing unit is part of a virtual machine in a cloud computing platform.

3. The method of claim 1 wherein the processing unit is part of an electronic device or server.

4. The method of claim 1 wherein the volatile memory is dynamically allocated to multiple processing units and wherein the predefined event is before reallocation of the memory from a first processing unit to a second processing unit such that any data stored inside the memory using the first processing unit leaks by the effect of the memory refreshment prevention before the second processing unit is being reallocated the memory.

5. The method of claim 4 wherein the processing units are part of one or more virtual machines in a computing cloud.

6. The method of claim 1, wherein the step of controlling the refresh circuitry for preventing the refreshment of the memory is implemented using processor executable instructions, said event being predefined using the processor executable instructions.

7. The method of claim 6 wherein the processor executable instructions are adapted to be run by a hypervisor running one or more virtual machines.

8. A non-transitory computer readable medium encoded with processor executable instructions for execution by a processing unit for controlling a refresh circuitry connected to a volatile memory for preventing refreshment of the memory at a predefined event, wherein the volatile memory is one or more memory banks of a dynamic random access memory (DRAM) and the refresh circuitry is a DRAM controller, and wherein, when executed, the processor executable instructions cause the processing unit to control the refresh circuitry by:
receiving and storing addresses of memory banks,
restricting access operations to these memory banks during a restriction time period to provide sufficient time for allowing leakage of data in the memory banks by preventing the refreshment of the memory, and
once the restriction time period is completed, resuming the refreshment of the memory.

9. The computer readable medium of claim 8 wherein said predefined event is before switching between a first user, process, application or service and a subsequent user, process, application or service when the volatile memory is connected to a processing unit accessible by multiple users, processes, applications or services such that any data stored inside the memory by the first user leaks by the effect of the memory refreshment prevention before the subsequent user, process, application or service is provided access to the memory.

10. The computer readable medium of claim 9 wherein the processing unit is part of a virtual machine in a computing cloud.

11. The computer readable medium of claim 9 wherein the processing unit is part of an electronic device or server.

12. The computer readable medium of claim 8 wherein the predefined event is before reallocation of the memory from a first processing unit to a second processing unit when the volatile memory is dynamically allocated to multiple processing units such that any data stored inside the memory using the first processing unit leaks by the effect of the memory refreshment prevention before the second processing unit is being reallocated the memory.

13. The computer readable medium of claim 12 wherein the processing units are part of one or more virtual machines in a computing cloud.

14. The computer readable medium of claim 13, wherein the processor executable instructions are adapted to be run by a hypervisor running one or more virtual machines.

15. A refresh circuitry adapted to be connected to a volatile memory requiring refreshment using the refresh circuitry to maintain data storage, the refresh circuitry being adapted to prevent the refreshment of the memory at the occurrence of a predefined event, wherein
the volatile memory for erasure is one or more memory banks of a dynamic random access memory (DRAM),
the refresh circuitry is a DRAM controller comprising a Content Addressable Memory (CMA) adapted to receive and store addresses of memory banks, restrict access operations to these memory banks during a restriction time period that provides sufficient time to allow leakage of data in the memory banks by preventing the refreshment of the memory, and once the restriction time period is completed, resume the refreshment of the memory.

16. The refresh circuitry of claim 15 wherein the event is predefined using processor executable instructions and wherein the refresh circuitry is adapted to receive an electrical signal from a processing unit executing said processor executable instructions for preventing the refreshment of the memory at the occurrence of said predefined event.

17. The refresh circuitry of claim 16 wherein the processor executable instructions are adapted to be run by a hypervisor running one or more virtual machines.

18. The refresh circuitry of claim 15 wherein the volatile memory is adapted to be connected to a processing unit accessible by multiple users, processes, applications or services and wherein the predefined event is before switching between a first user, process, application or service and a subsequent user, process, application or service such that any data stored inside the memory by the first user leaks by the effect of the memory refreshment prevention before the subsequent user is provided access to the memory.

19. The refresh circuitry of claim 18, wherein the processing unit is part of a virtual machine in a computing cloud.

20. The refresh circuitry of claim 18, wherein the processing unit is part of an electronic device or server.

21. The refresh circuitry of claim 15, wherein the volatile memory is adapted to be dynamically allocated to multiple processing units and wherein the predefined event is before reallocation of the memory from a first processing unit to a second processing unit such that any data stored inside the memory using the first processing unit leaks by the effect of the memory refreshment prevention before the second processing unit is being reallocated the memory.

22. The refresh circuitry of claim 21 wherein the processing units are part of one or more virtual machines in a computing cloud.

* * * * *